United States Patent
Kawada

(10) Patent No.: US 7,582,193 B2
(45) Date of Patent: *Sep. 1, 2009

(54) METHOD FOR PRODUCING MULTILAYER FILM PERPENDICULAR MAGNETIC RECORDING MEDIUM

(75) Inventor: Yasuyuki Kawada, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 670 days.

This patent is subject to a terminal disclaimer.

(21) Appl. No.: 11/103,653

(22) Filed: Apr. 11, 2005

(65) Prior Publication Data

US 2005/0249870 A1 Nov. 10, 2005

(30) Foreign Application Priority Data

Apr. 9, 2004 (JP) .............................. 2004-114841

(51) Int. Cl.
*C23C 14/32* (2006.01)

(52) U.S. Cl. .............................. 204/192.12; 204/192.2; 428/832.1; 427/131; 427/132

(58) Field of Classification Search ............ 204/192.12, 204/192.2; 427/131, 132; 428/832.1
See application file for complete search history.

(56) References Cited

U.S. PATENT DOCUMENTS

| | | | |
|---|---|---|---|
| 4,749,628 A | | 6/1988 | Ahlert et al. |
| 5,679,473 A | * | 10/1997 | Murayama et al. ........ 428/836.3 |
| 6,404,605 B2 | * | 6/2002 | Shiroishi ................... 360/324 |
| 6,596,418 B2 | | 7/2003 | Maesaka et al. |

(Continued)

FOREIGN PATENT DOCUMENTS

JP 2001-291230 A 10/2001

(Continued)

OTHER PUBLICATIONS

Australian Patent Office Search Report and Written Opinion issued for corresponding Australian Patent Application No. SG200500720-8, dated Feb. 21, 2007.

(Continued)

*Primary Examiner*—Nam X Nguyen
*Assistant Examiner*—John Brayton
(74) *Attorney, Agent, or Firm*—Rossi, Kimms & McDowell, LLP

(57) ABSTRACT

A method for producing a magnetic recording medium in which the noise of the magnetic recording medium is reduced and the thermal stability of the recorded magnetization is improved, while enabling easy writing to be carried out by a recording head, is disclosed. The magnetic recording medium of the present invention includes an underlayer having an hcp crystal structure and a magnetic layer produced by a multilayer lamination of Co/Pt or the like. The deposition rate of the underlayer is equal to or lower than 0.7 nm/second. The magnetic layer contains added silicon oxide at 1 to 10 mol %. The present method includes a step for subjecting the surface of the underlayer to Ar gas mixed with oxygen of a mass/flow rate ratio of 1% to 10% under a gas pressure of 0.1 to 10 Pa for 1 to 10 second(s). The magnetic recording medium may include an orientation control layer and a soft magnetic backing layer. Ku, $Ku_1$, and $Ku_2$ are controlled to provide both of thermal stability and easy writing.

7 Claims, 3 Drawing Sheets

U.S. PATENT DOCUMENTS

| | | | |
|---|---|---|---|
| 6,858,320 B2 * | 2/2005 | Takenoiri et al. | 428/611 |
| 6,884,520 B2 * | 4/2005 | Oikawa et al. | 428/836.2 |
| 6,947,235 B2 | 9/2005 | Albrecht et al. | |
| 7,045,225 B2 * | 5/2006 | Watanabe et al. | 428/828 |
| 7,056,605 B2 * | 6/2006 | Kawada | 428/832.1 |
| 7,150,895 B2 * | 12/2006 | Watanabe et al. | 427/126.3 |
| 2002/0064691 A1 * | 5/2002 | Kanbe et al. | 428/694 TS |
| 2003/0064253 A1 | 4/2003 | Uwazumi et al. | |
| 2003/0152809 A1 * | 8/2003 | Oikawa et al. | 428/694 TS |
| 2004/0110034 A1 | 6/2004 | Kawada | |
| 2005/0052793 A1 | 3/2005 | Hong et al. | |

FOREIGN PATENT DOCUMENTS

| | | |
|---|---|---|
| JP | 2002-358617 A | 12/2002 |
| JP | 2003-091812 A | 3/2003 |
| JP | 2003-123245 A | 4/2003 |
| JP | 2003-178413 A | 6/2003 |
| JP | 2003-217107 A | 7/2003 |
| JP | 2003-242622 A | 8/2003 |
| JP | 2003-317223 A | 11/2003 |
| WO | 03/071300 A1 | 8/2003 |

OTHER PUBLICATIONS

Notification of Reasons for Refusal issued in corresponding Japanese patent application No. 2004-114841, dated Nov. 20, 2008.

* cited by examiner

METHOD FOR PRODUCING MULTILAYER FILM PERPENDICULAR MAGNETIC RECORDING MEDIUM

CROSS REFERENCE TO RELATED APPLICATIONS

This application claims priority from application Serial No. JP 2004-114841, filed on Apr. 9, 2004, the contents of which are incorporated herein by reference in their entirety.

BACKGROUND OF THE INVENTION

A. Field of the Invention

The present invention relates to a method for producing a perpendicular magnetic recording medium used for a magnetic recording apparatus. In particular, the present invention relates to a perpendicular magnetic recording medium that has a high recording density, a superior read-write characteristic, that is written to easily, and that has high thermal stability.

B. Description of the Related Art

Recently, a magnetic recording apparatus having a larger capacity and a smaller size has been desired as a memory device for a personal computer or a workstation. In order to achieve this, a magnetic recording medium must have a higher recording density. One of the magnetic recording methods in present use is the in-plane magnetic recording method (or a longitudinal magnetic recording method) which has an easy magnetization axis in a direction parallel to a magnetic recording medium surface. In order to improve recording density in the in-plane magnetic recording method, it is required to reduce the product of the residual magnetization (Br) of a magnetic film of a magnetic recording medium and a magnetic layer thickness (t). Coercivity (Hc) also must be increased. Thus, an attempt has been made to reduce the film thickness of a magnetic film to control the grain diameter of magnetic crystals. However, the in-plane magnetic recording method is disadvantageous in that a demagnetizing field is increased in accordance with the shortening of bit length to cause the reduction of the residual flux density, thus reducing the reproduction output. The in-plane magnetic recording method also has a problem with respect to thermal stability, which is brought about by the smaller magnetic crystal grains or thinner film. Therefore, it appears to be technically difficult to use this method to provide a magnetic recording medium having a higher density.

On the other hand, a perpendicular magnetic recording method has been explored as a means for solving the above-described problems and for improving the surface recording density. In the perpendicular magnetic recording method, a magnetic recording medium is provided in which the easy magnetization axis of a magnetic film is perpendicular to a substrate face, and neighboring magnetizations in a magnetization transition region are not opposed to each other. Thus, even when bit length is reduced, the magnetization is stable and the reduction in magnetic flux as in the in-plane magnetic recording is small. Therefore, this medium is appropriate as a high density magnetic recording medium.

As described above, the perpendicular magnetic recording medium is more advantageous as a high density magnetic recording medium than the in-plane magnetic recording medium. However, in the case of a perpendicular magnetic recording medium, segregation of non-magnetic elements at a magnetic crystal grain boundary is not satisfactorily performed, causing a problem in which magnetic interaction among magnetic crystal grains is increased, giving rise to increased noise. Therefore, conventionally an attempt has been made to improve the layer structure of the perpendicular magnetic recording medium, in order to achieve a high density magnetic recording or the reduction of the medium noise.

As a known structure of a perpendicular magnetic recording medium, a bilaminar perpendicular magnetic recording medium has been disclosed in which a non-magnetic substrate consisting of aluminum, glass or the like, for example, has an overlying soft magnetic backing layer on which an underlayer for the perpendicular magnetic layer is provided. The underlayer has thereon a perpendicular magnetic layer and a protection layer. As a perpendicular magnetic layer, many perpendicular magnetic layers have been examined, including a perpendicular magnetic layer consisting of a Co-base alloy, e.g., CoCr, CoCrTa or CoCrPt; a multilayer lamination perpendicular magnetic layer in which a Co layer and a Pt layer or a Co layer and a Pd layer are alternately laminated (hereinafter simply referred to as Co/Pt, Co/Pd or the like); an amorphous perpendicular magnetic layer, e.g., TbCo or TbFeCo; and, recently, a perpendicular magnetic layer including an oxide, e.g., CoPtCrO or CoPtCr—$SiO_2$ (see Japanese Patent Laid-Open Publication No. 2003-178413, for example). When a perpendicular magnetic layer includes oxide, a non-magnetic substance (oxide) is segregated at the magnetic crystal grain boundary to provide a superior perpendicular magnetic recording medium that has a small magnetic crystal grain diameter and that has a small magnetic exchange interaction among magnetic crystal grains.

Co/Pt and Co/Pd in particular have been actively researched as a future high recording density medium because they have a high perpendicular magnetic anisotropy constant (Ku) and thus have a high thermal stability and a high coercivity, and a squareness ratio 1.0 is easily obtainable (see Japanese Patent Application No. 2003-206091, for example). On the other hand, a magnetic recording head for writing information to a magnetic recording medium has a limitation on the magnetic field that may be generated due to the writing process, and thus it has difficulty in writing when the magnetic recording medium has a high anisotropic magnetic field (Hk). For a conventional magnetic recording medium, the increase in Ku causes an increase in Hk, thus making it difficult to provide both thermal stability and ease of writing by the recording head.

The present invention is directed to overcoming or at least reducing the effects of one or more of the problems set forth above.

SUMMARY OF THE INVENTION

The present invention has been made in view of the problems described above, and provides a method for producing a magnetic recording medium that has both a high Ku and low Hk.

The present invention also provides a method for producing a magnetic recording medium in which the noise of a magnetic recording medium is reduced and the thermal stability of a recorded magnetization is improved, while also enabling easy writing by a recording head.

In order to achieve the objective as described above, the present invention provides a method for producing a perpendicular magnetic recording medium, comprising forming a non-magnetic underlayer having a hexagonal close-packed crystal structure on a non-magnetic substrate and forming a magnetic layer comprising a multilayer lamination in which a Co layer as a first magnetic layer and a Pt layer or a Pd layer as a second magnetic layer are alternately laminated directly over the underlayer, wherein the underlayer is formed with a deposition rate equal to or lower than 0.7 nm/second. The underlayer preferably is formed with a sputter method, and preferably consists of Ru.

At least one of the first and second magnetic layers preferably has added silicon oxide. More preferably, $SiO_2$ is used. Silicon oxide preferably is added in an amount equal to or higher than 1 mol % and equal to or lower than 10 mol %.

Using the structure as described above, improvement in thermal stability of a recorded magnetization and easy writing by a recording head can both be provided. The reason will be described hereinafter.

In order to improve the thermal stability of the magnetization recorded in a perpendicular magnetic recording medium, a perpendicular magnetic anisotropy constant (Ku) is desirably higher. Specifically, when assuming that the volume of a magnetic grain is V, the magnetization recorded in the magnetic recording medium has a magnetic anisotropic energy represented by KuV. Taking the Boltzmann constant as k and the absolute temperature as T, the surrounding environment has a heat energy represented by kT and the thermal stability of the recorded magnetization is represented by KuV/kT. Thus, to improve the thermal stability requires an increase in Ku.

An increase in Ku generally causes an increase in Hc and/or Hk, thus making it difficult for the recording head to write to the magnetic recording medium. On the other hand, Ku is given by $Ku=Ku_1+Ku_2$. In this formula, $Ku_1$ and $Ku_2$ represent uniaxial anisotropy constants. A magnetic field required for providing the inversion of magnetization when a magnetic recording medium is recorded (switching magnetic field) is Hk. When saturation magnetization is assumed to be Ms, $Hk=2Ku_1/Ms$ is given. Thus, the smaller $Ku_1$ is, the smaller Hk is, thus providing easier writing to the magnetic recording medium.

As described above, in order to provide a superior read-write characteristic, $Ku_1$ must be reduced. In order to improve the thermal stability of a recorded magnetization, Ku must be increased, and this can be done by increasing the $Ku_2/Ku_1$ ratio, since $Ku=Ku_1+Ku_2$.

As described above, in order to provide a superior read-write characteristic and to improve the thermal stability of a recorded magnetization, the present invention uses a multilayer lamination film, e.g., Co/Pt, as a magnetic layer to obtain a high Ku and controls the crystal structure and deposition rate of an underlayer provided immediately beneath the magnetic layer, thereby realizing a magnetic recording medium having a high $Ku_2/Ku_1$ ratio.

It is preferable to subject the surface of the underlayer to Ar gas being mixed with oxygen of a mass/flow rate ratio of 1% to 10% and having a gas pressure of 0.1 to 10 Pa for 1 to 10 seconds before forming the magnetic layer. By doing this, the surface of the underlayer of a hexagonal close-packed crystal structure (hcp) can absorb oxygen and the slope of a magnetization curve in the vicinity of Hc can be made to be gentle so that the magnetic interaction among grains of the perpendicular magnetic layer can be reduced, thus achieving the objective of the present invention more effectively.

Preferably, an orientation control layer is incorporated between the non-magnetic substrate and the underlayer, in order to ensure that the crystals of the underlayer have a C axis orientation perpendicular to the substrate face. The orientation control layer is provided by layering a first orientation control layer and a second orientation control layer. The first orientation control layer is preferably a Ta layer and the second orientation control layer is preferably any one of a NiFeNbB layer, a NiFeCr layer, and a NiFeSi layer. It also is preferable that the non-magnetic substrate and the orientation control layer have a soft magnetic backing layer between them.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

According to the present invention, a multilayer lamination film, e.g., Co/Pt, is used to provide a high Ku. The underlayer has an hcp crystal structure, and its deposition rate is equal to or lower than 0.7 nm/second. Thus, both high Ku and low Hk can be compatible to provide a perpendicular magnetic recording medium that has high thermal stability and can be written to easily.

Hereinafter, an embodiment of the present invention will be described with reference to the drawings.

Figure 1:
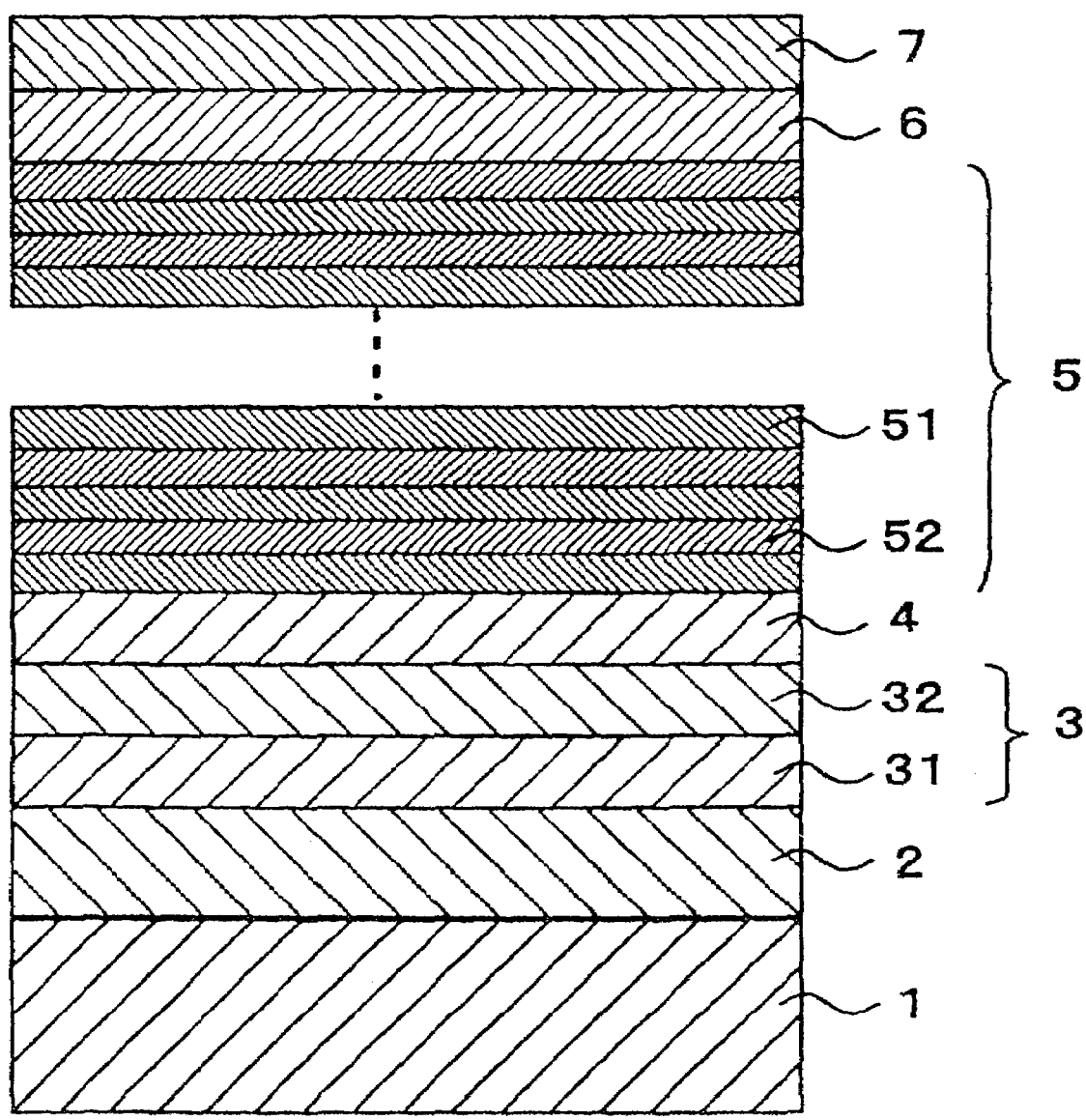
FIG. 1 is a schematic view for explaining an example of the structure of the perpendicular magnetic recording medium according to the present invention.

FIG. 1 is a schematic view for explaining an exemplary structure of a perpendicular magnetic recording medium using the production method of the present invention. In FIG. 1, non-magnetic substrate 1 has thereon a lamination structure of soft magnetic backing layer 2, orientation control layer 3, underlayer 4, magnetic layer 5, and protection layer 6 that are provided in this order. Protection layer 6 has thereon lubricant layer 7. Orientation control layer 3 is provided by first orientation control layer 31 and second orientation control layer 32. Magnetic layer 5 has a structure in which first magnetic layer 51 and second magnetic layer 52 are alternately layered to provide a multilayer lamination.

The layers from soft magnetic backing layer 2 to protection layer 6 are provided by a film forming method such as a sputter method, e.g., DC magnetron sputtering or RF magnetron sputtering, vapor deposition, CVD, or plating. The respective layers may be provided by different film formation methods depending on the function required for the respective layers, but are preferably formed with a continuous film formation using the same film formation method, from the viewpoint of productivity.

Underlayer 4 is a layer provided just under magnetic layer 5 and is provided in order to favorably control the crystal orientation, crystal grain diameter, and grain boundary segregation of the magnetic layer. With regards to materials for underlayer 4, a metal or an alloy having a hexagonal close-packed crystal structure (hcp) can be used to provide an axis c of magnetic layer 5 that is perpendicular to the substrate face. Preferable materials having this hcp structure include Ti, Re, Ru, Os, Zr, Zn, and Tc or an alloy thereof. A particularly preferred material is Ru because it has a small reactivity to oxygen included in the non-magnetic grain boundary element of first magnetic layer 51 (which will be described later) and thus is prevented from disturbing the crystal orientation of Co which is a main element of the ferromagnetic crystal grains of first magnetic layer 51.

Film formation methods for underlayer 4 include: a sputter method, e.g., DC magnetron sputtering or RF magnetron sputtering, vapor deposition or CVD. The sputter method is preferably used in order to preferably control the crystalline characteristic and the deposition rate of the underlayer.

By providing the deposition rate of underlayer 4 to be equal to or lower than 0.7 nm/second, a preferable underlayer can be formed to increase $Ku_2$ of magnetic layer 5. When $Ku_2$ is increased, Ku of the magnetic layer can be maintained high while reducing Hk to provide both thermal stability of the magnetic recording medium and an easy writing by a recording head. Although a lower deposition rate of the underlayer can provide the effect by the increase of $Ku_2$ more effectively, the deposition rate is preferably equal to or higher than 0.3 nm/second from the viewpoint of productivity.

The film thickness of underlayer 4 is not particularly limited. However, from the viewpoints of improvement in the read-write resolution and productivity, a minimal film thickness required for controlling the crystal structure of first magnetic layer 51 is preferable, this film thickness preferably being equal to or higher than 3 nm and equal to or lower than 20 nm. This range will enable sufficient crystal growth in underlayer 4.

When the surface of underlayer 4 is subjected to an oxygen adsorption processing to subsequently form magnetic layer 5, the magnetic characteristic of magnetic layer 5 can be further increased. Specifically, when the surface of underlayer 4 is subjected to an oxygen adsorption, an advantage is provided in which the magnetic interaction among magnetic grains of magnetic layer 5 provided on this underlayer 4 is suppressed and the slope a of the magnetization curve in the vicinity of Hc (also referred to as "α" in the present specification) is gentle, which provides easy read-write operation. The oxygen adsorption to underlayer 4 is performed by subjecting the surface of underlayer 4 to Ar gas mixed with oxygen of a mass/flow rate ratio of 1% to 10% and gas pressure of 0.1 to 10 Pa for 1 to 10 seconds after it is formed. The above-mentioned a is an indicator representing the magnitude of the magnetic interaction among magnetic grains constituting magnetic layer 5. When a is small, it shows that the medium noise is reduced, because the magnetic interaction among magnetic grains is reduced.

Non-magnetic substrate 1 can be made of an Al alloy provided with a NiP plating, reinforced glass or crystallized glass or the like, which are used for a normal magnetic recording medium. When the temperature for heating a substrate is kept below 100° C., a plastic substrate consisting of a resin, e.g., polycarbonate, polyolefin, can be used.

Soft magnetic backing layer 2 is a layer that is preferably formed in order to control the magnetic flux from a magnetic head used for a magnetic recording thereby to improve the read-write characteristics, but this layer can be omitted. The soft magnetic backing layer can be provided by a crystalline NiFe alloy, SENDUST (FeSiAl) alloy, CoFe alloy or the like, FeTaC, CoTaZr, CoFeNi, CoNiP or the like having a microcrystalline characteristic, for example. However, an amorphous Co alloy, e.g., CoNbZr or CoTaZr, can be used to provide an improved electromagnetic conversion characteristic. The optimal film thickness of soft magnetic backing layer 2 depends on the structure and characteristics of the magnetic recording head. However, when soft magnetic backing layer 2 is subjected to a continuous film formation with other layers, the film thickness of soft magnetic backing layer 2 is preferably equal to or higher than 10 nm and equal to or lower than 500 nm, in consideration of productivity. The film thickness of soft magnetic backing layer 2 also can be increased to a few μm when a plating method or the like is used prior to the film formation of other layers to previously form soft magnetic backing layer 2 on a non-magnetic base substrate.

Orientation control layer 3 is a layer that is preferably formed in order to control the crystal orientation, crystal grain diameter or the like of underlayer 4 and is more preferably formed by a plurality of layers. This orientation control layer may also be omitted.

Orientation control layer 3 can be provided by a non-magnetic material or a soft magnetic material. When soft magnetic backing layer 2 is formed under the orientation control layer, a soft magnetic material that can function as a part of the soft magnetic layer backing layer preferably is used.

Materials for orientation control layer 3 showing a soft magnetic characteristic include a Ni-base alloy, (e.g., NiFe, NiFeNb, NiFeB, or NiFeCr, and a Co-base alloy, e.g., Co or CoB, CoSi, CoNi, or CoFe. The above materials may also be layered to provide a plurality of layers in order to separately provide a function for securing the consistency in crystal lattice and a function for controlling the crystal grain diameter.

When Ru is used for underlayer 4, in order to preferably control Ru in the hcp crystal structure, second orientation control layer 32 preferably uses an alloy including Ni as a main element. An NiFe-base material, e.g., NiFeNbB alloy, NiFeCr alloy, or NiFeSi alloy, is particularly preferable because the crystal orientation of Ru can be provided in the axis c to be perpendicular to the substrate face and the crystal orientation of the perpendicular magnetic layer above the underlayer can be provided in the axis c to be perpendicular to the substrate face. The composition of NiFeCr alloy is provided such that Fe is 10 to 20 at %, Cr is 20 to 30 at %, and the remainder is Ni in a range which enables the best read-write characteristic. The composition of NiFeNbB alloy comprises Fe at 10 to 20 at %, Nb at 2 to 10 at %, B at 2 to 6 at %, and the remainder Ni, which is in a range by which the best read-write characteristic is provided in the composition showing the soft magnetic characteristic. The composition of NiFeSi alloy comprises Fe at 10 to 20 at %, Si at 2 to 10 at %, and the remainder Ni, which is a range showing a soft magnetic characteristic by which the best read-write characteristic. NiFeCr having the above composition is non-magnetic but NiFeNbB and NiFeSi are soft magnetic and an effect for improving the recording status by the reduction of the thickness of the soft magnetic film can be simultaneously provided, which is an additional advantage.

When second orientation control layer 32 has a film thickness equal to or lower than 5 nm, the crystal orientation of underlayer 4 cannot be controlled and a film thickness exceeding 30 nm causes an excessively high Hc, which prevents a currently-available head from providing saturation recording, causing an inconvenience in the recording.

Furthermore, when an alloy having Ni as a main element is used for second orientation control layer 32, first orientation control layer 31 is preferably further provided. In this case, a layer consisting of Ta is particularly preferable as first orientation control layer 31 so that first orientation control layer 31 can cooperate with second orientation control layer 32 having Ni as a main element, which preferably controls the crystal structure of the underlayer 4 as an hcp structure. When the Ta layer 31 has a film thickness lower than 1 nm, the NiFe layer has a deteriorated crystal orientation thus the crystal orientation of underlayer 4 cannot be controlled. When the thickness is greater than 5 nm, the distance between magnetic layer 5 and soft magnetic backing layer 2 is increased, which also deteriorates the read-write characteristic. Therefore, the Ta layer as first orientation control layer 31 preferably has a film thickness of 1 to 5 nm, while the NiFeCr layer, NiFeNbB layer or NiFeSi layer as second orientation control layer 32 preferably has a film thickness of 5 to 30 nm. Orientation control layer 31 is not always required to have a multilayer structure consisting of a plurality of layers, and may be an orientation control layer having a single layer if desired.

Magnetic layer 5 is basically provided as a multilayer lamination film which is obtained by providing the Co layer as first magnetic layer 51 and the Pt layer or Pd layer as second magnetic layer 52 to provide a multiple layer lamination. Silicon oxide preferably is added to both or either one of first magnetic layer 51 and second magnetic layer 52.

The reason why the multilayer lamination film of Co/Pt or Co/Pd is used for magnetic layer 5 is that Hc is increased as compared to a magnetic layer such as a Co—Cr alloy, the squareness ratio easily becomes 1, and the interface magnetic anisotropic characteristic can be used to provide a high Ku. The purpose of adding a silicon oxide to both or any one of Co layer and Pt layer or Co layer and Pd layer for constituting these multilayer lamination films is to further improve Hc of the medium and to improve the read-write characteristic. Specifically, the addition of silicon oxide allows the grain boundary of the ferromagnetic crystal grains constituting the respective layers of Co layer, Pt layer, and Pd layer to have the segregation of non-magnetic silicon oxide, thus causing the respective ferromagnetic crystal grains to be minute and isolated, and reducing the interaction among the crystal grains. By doing this Hc can be increased as compared to a magnetic layer such as Co/Pt to which silicon oxide has not been added, to provide a higher recording density. In the following section, when the addition of silicon oxide to Co layer, Pt layer, and Pd layer is specifically described, the addition will be described as Co—$SiO_2$ layer, Co—$SiO_x$ layer, Pt—$SiO_x$ layer, and Pd—$SiO_x$ layer, for example.

The composition of silicon oxide added to magnetic layer 5 is $SiO_x$ (0<x=2), but most preferably is $SiO_2$. The addition amount of silicon oxide preferably is within the range of 2 to 10 mol % in the case of a Co—$SiO_x$ layer, 1 to 8 mol % in the case of a Pt—$SiO_x$ layer, and 2 to 8 mol % in the case of a Pd—$SiO_x$ layer. This is because the addition amount of silicon oxide lower than this causes an insufficient segregation of silicon oxide to the crystal grain boundary, while a silicon oxide amount higher than this causes Hc to be excessively reduced.

The respective layers for constituting magnetic layer 5 can have various thicknesses, according to the magnetic characteristics desired. However, for example, the Co layer or the Co—$SiO_x$ layer has a film thickness of 0.2 to 0.8 nm, the Pt layer or Pt—$SiO_x$ layer has a film thickness of 0.05 to 1.2 nm, and the Pd layer or Pd—$SiO_x$ layer has a film thickness of 0.5 to 1.5 nm. Preferably, the Co layer or the Co—$SiO_x$ layer has a film thickness of 0.2 to 0.5 nm, the Pt layer or Pt—$SiO_x$ layer has a film thickness of 0.05 to 0.4 nm, and the Pd layer or Pd—$SiO_x$ layer has a film thickness of 0.5 to 1 nm.

Magnetic layer 5 is preferably formed by a sputtering method using as a sputter gas a gas including Ar as an element. The sputter gas may be pure Ar gas, a mixed gas of Kr and Ar, or a mixed gas of Xe and Ar, for example. Such sputter gas may be added with oxygen gas in the range of mass/flow rate ratio from 0.05 to 0.5%.

Protection layer 6 may be provided by a conventionally used protection film, for example, a protection film mainly including carbon. Lubricant layer 7 also may be provided by a conventionally used material and may use, for example, a perfluoropolyether liquid lubricant. With regards to the conditions such as the film thickness of protection layer 6 and the film thickness of lubricant layer 7, conditions used for a normal magnetic recording medium can be directly used.

First Embodiment

In this embodiment, an example of an effect of the deposition rate of the underlayer to the ratio of $Ku_2/Ku_1$ will be described. A perpendicular magnetic recording medium of this embodiment has a structure shown in FIG. 1 and was provided by laminating glass substrate 1, soft magnetic backing layer 2 of CoZrNb, first orientation control layer 31 of tantalum, second orientation control layer 32 of NiFeNbB, underlayer 4 of ruthenium, magnetic layer 5 consisting of Co—$Sio_2$ and Pt, carbon protection layer 6, and perfluoropolyether lubricant layer 7, in this order.

The glass substrate had a diameter of 2.5 inches and thickness of 0.635 mm. The substrate was cleaned well before being attached to a film formation apparatus and the following film formation of the respective layers was performed. In this film formation method, the film layers from the soft magnetic backing layer to the protection layer were prepared by the DC magnetron sputter method.

First, CoZrNb was formed as soft magnetic backing layer 2. The target used was $Co_{87}Zr_5Nb_8$ (the subscripts hereinafter show atomic %). Ar gas was used to perform sputtering with a gas pressure of 1 Pa to form a film having a film thickness of 200 nm. The film formation temperature was room temperature. CoZrNb had a sufficient soft magnetic characteristic even in the amorphous state when the film formation was performed at room temperature. Layer 31 of tantalum was continuously formed on the CoZrNb soft magnetic film. The target used was pure Ta. Sputtering was performed in Ar gas to form a film having a film thickness of 3 nm. The film formation was performed at room temperature and the gas pressure was 1 Pa. Layer 32 of NiFeNbB was continuously formed on the Ta layer. The target used had a composition of $Ni_{79}Fe_{12}Nb_3B_6$. Sputtering was performed in Ar gas to form a film having a film thickness of 25 nm. The film formation was performed at room temperature and the gas pressure was 1 Pa. Layer 31 of Ta and layer 32 of NiFeNbB were both used for providing the hcp crystal structure to the Ru underlayer to be formed next.

Next, a layer of ruthenium as underlayer 4 was formed. The target used was pure Ru. Sputtering was performed in Ar gas to form a film having a film thickness of 7 nm. The film formation was conducted at room temperature and the gas pressure was 4 Pa. The film formation was performed while changing the deposition rate from 0.3 nm/second to 1 nm/second. For comparison, the deposition rate was varied over a wide range. The formed Ru layer showed a hcp crystal structure. Next, the Ru underlayer was subjected to a mixed gas consisting of Ar and oxygen, at a mass/flow rate ratio of 2% and gas pressure of 1 Pa for 10 seconds. As a result, the Ru surface absorbed an appropriate amount of oxygen. This oxygen adsorption allowed the slope of the magnetization curve in the vicinity of Hc to be gentle. This showed that the magnetic exchange interaction among grains was reduced, and thus the recording characteristic was improved. Absorption of oxygen by the Ru surface had an effect as described above.

On Ru underlayer 4, magnetic layer 5 was formed by the Co—$SiO_2/Pt_1$ multilayer lamination film. Two types of targets were used. One target had a composition of 94 mol % Co-6 mol % $SiO_2$ and the other was pure Pt. Both of the targets were simultaneously subjected to an electric discharge while being rotated during sputtering to laminate the Co—$SiO_2$ layer and the Pt layer alternately. Sputtering was performed in Ar gas to form a Co layer having a film thickness of 0.5 nm and a Pt layer having a film thickness of 0.28 nm. The film formation was performed for 14 cycles (28 layers) to provide a magnetic layer of about 11 nm thickness. The film formation was performed at room temperature, and at a gas pressure of 5 Pa.

Next, the C—N film was formed as protection layer 6. The target used was C. Ar gas mixed with nitrogen gas having a mass/flow rate ratio of 4% was used to perform sputtering to form a film of 7 nm thickness. The film formation was performed at room temperature, and the Ar gas pressure was 1 Pa. Finally, lubrication layer 7 consisting of perfluoropolyether was coated by a dip method, which completed a perpendicular magnetic recording medium.

Second Embodiment

In this embodiment, the amount of $SiO_2$ added to the Co—$SiO_2$ layer was altered. The second embodiment comprises a perpendicular magnetic recording medium as in the first embodiment except that, when magnetic layer 5 was formed, one target had a composition of 91 mol % Co-9 mol % $SiO_2$ and the other target was pure Pt.

Figure 2:
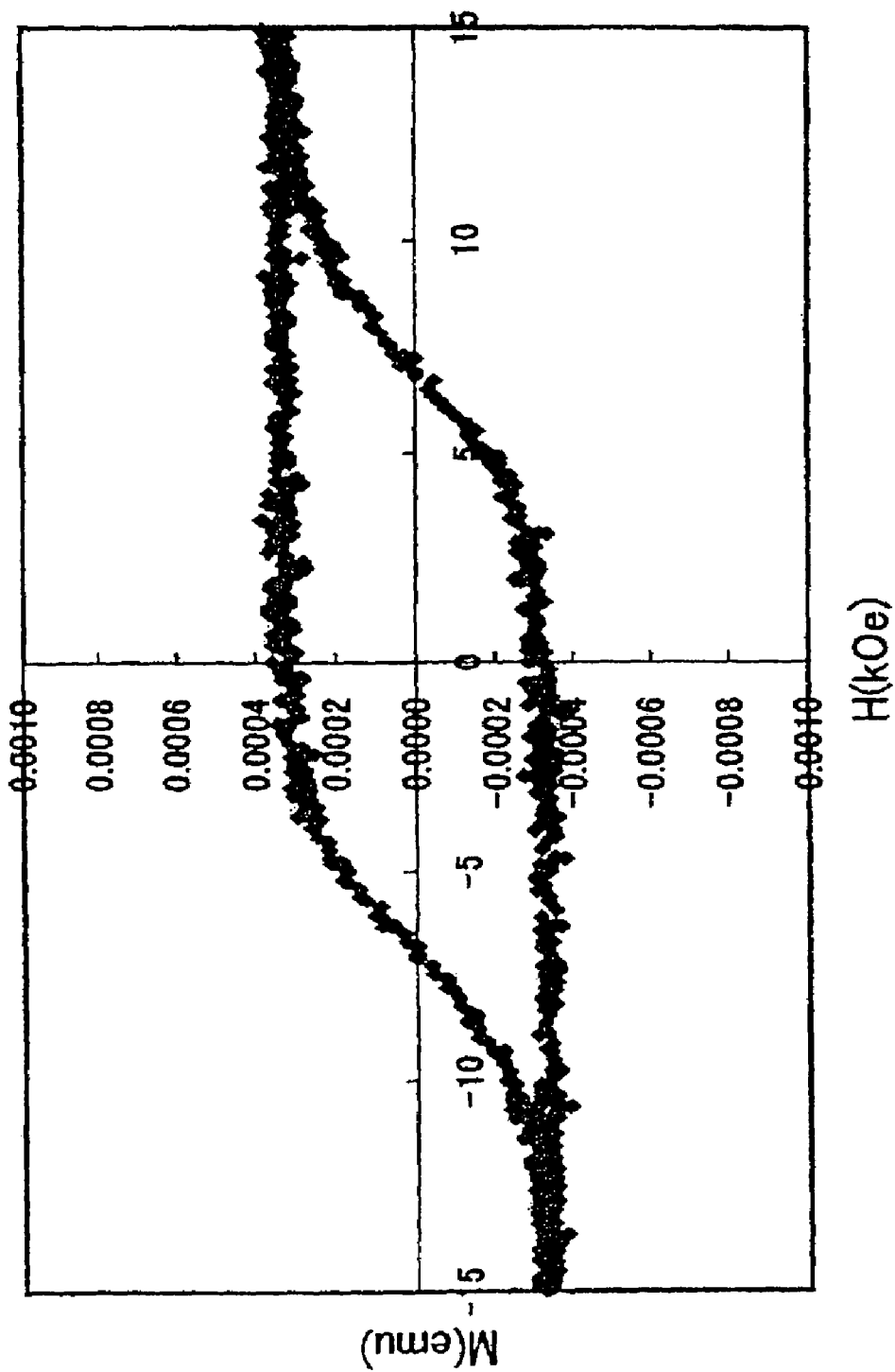
FIG. 2 shows the M-H curve of the perpendicular magnetic recording medium of the first embodiment.

Evaluation of the Perpendicular Magnetic Recording Media of the First Embodiment and Second Embodiment FIG. 2 shows the M—H curve of the perpendicular magnetic recording medium prepared in the first embodiment. The magnetic characteristic is that Hc=6.9 kOe, Ms=410 emu/cc, S=1.0, Hn=−3.4 kOe, and α=1.4. S represents the squareness ratio and Hn represents a magnetic field in which the inversion of a magnetic domain is generated. Thus, the perpendicular magnetic recording medium with the Co/Pt multilayer lamination provided high Hc, Hn, and S, and low α.

Figure 3:
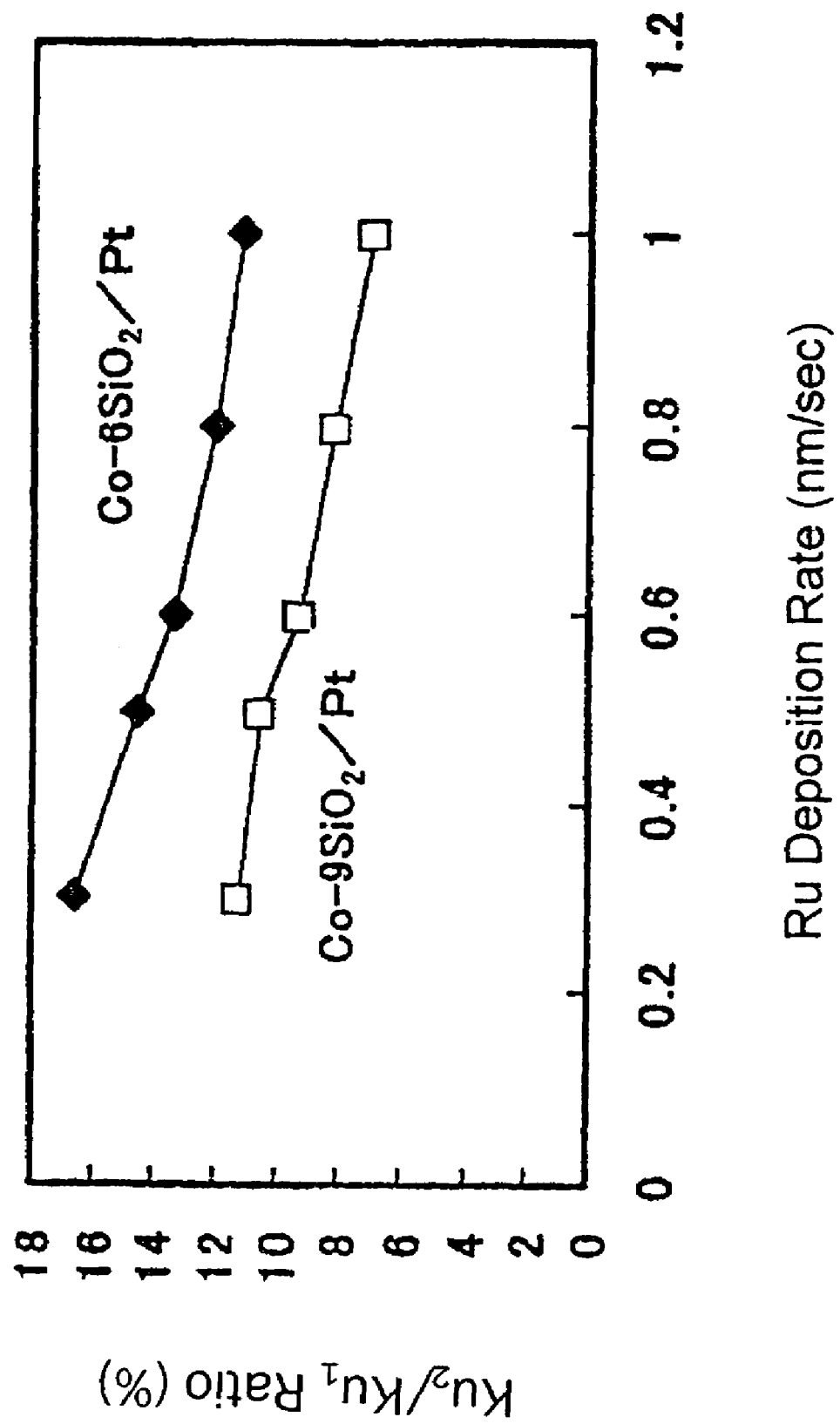
FIG. 3 illustrates the relation between the deposition rate of the underlayer and $Ku_2/Ku_1$ ratio.

FIG. 3 shows the result of evaluating the effect by the Ru deposition rate to the $Ku_2/Ku_1$ ratio when the perpendicular magnetic recording media prepared by the First and Second Embodiments were used. The procedure as shown below was used to measure Ku, $Ku_1$, and $Ku_2$. Under the conditions in which the magnetization of the magnetic layer was almost saturated, a torque magnetometer was used to measure the magnetic torque curves under the applied magnetic field H in a range from 10 kOe to 25 kOe, and the magnetic torque curves to the respective magnetic fields H were subjected to Fourier analysis. Then, by using the relation in which the crystal magnetic anisotropic energy E of the magnetic film is approximated by $E=Ku_1 \sin^2\theta + Ku_2 \sin^4\theta$ (θ is an angle given by the spontaneous magnetization and the easy magnetization axis of the magnetic film), Ku and $Ku_2$ to the respective application magnetic fields H were calculated. The Ku and $Ku_2$ for the respective magnetic fields H calculated in this manner were plotted by the inverse of the magnetic field (1/H) and were approximated in a straight line. Specifically, Ku was defined as such a value that is obtained by adding a value obtained by the extrapolation in the straight line to 1/H=0 (i.e., intercept "y") to $2\pi Ms^2$ (Ms represents saturation magnetization). $Ku_2$ was defined as such a value that is obtained by directly using a value by the extrapolation in the above straight line. Since $Ku=Ku_1+Ku_2$, $Ku_1$ was defined as a value obtained by Ku−$Ku_2$.

The deposition rate was defined in the manner described below. A time at which the electric discharge voltage for sputtering is applied in order to start the film formation of the underlayer was taken as the start time, while a time at which the electric discharge voltage for sputtering was reduced in order to finish the film formation of the underlayer was taken as the finish time. The time from the start time to the finish time is defined as a film formation time (seconds). The thickness of the deposited underlayer was divided by the film formation time and a resultant value was taken as the deposition rate.

As can be seen from FIG. 3, the lower the Ru deposition rate is, the higher the $Ku_2/Ku_1$ ratio is, regardless of the amount of $SiO_2$ added to Co. A deposition rate equal to or lower than 0.7 nm/second causes a rapid increase in the $Ku_2/Ku_1$ ratio. A deposition rate equal to or lower than 0.5 nm/second in particular causes the $Ku_2/Ku_1$ ratio to exceed 10% regardless of the amount of $SiO_2$ added to Co. If the deposition rate is too slow, the time required for the film formation of the underlayer is increased excessively to cause a problem from the viewpoint of productivity. Thus, in the case of the film thickness of the underlayer of the present invention, the underlayer is preferably deposited with a deposition rate equal to or higher than 0.3 nm/second.

Table 1 shows Ku, $Ku_1$, $Ku_2$, $Ku_2/Ku_1$, Hk, Hk (calculation) of the perpendicular magnetic recording medium of Embodiment 1. The term "Hk (calculated)" is obtained by calculating the value of Hk when $K_2$ is assumed as 0. It indicates the effect of $K_2$.

TABLE 1

| Ru deposition rate | Ku ($*10^6$ erg/cc) | $Ku_1$ ($*10^6$ erg/cc) | $Ku_2$ ($*10^6$ erg/cc) | $Ku_2/Ku_1$ (%) | Hk (kOe) | Hk (calculated) (kOe) |
|---|---|---|---|---|---|---|
| 1 nm/second | 5.0 | 4.5 | 0.5 | 11.1 | 21.9 | 24.4 |
| 0.5 nm/second | 5.5 | 4.8 | 0.7 | 14.5 | 21.1 | 23.9 |

When the deposition rate of the underlayer is 0.5 nm/second, Ku is significantly increased as compared to a deposition rate of 1.0 nm/second. However, $Ku_2$ is increased and thus Hk is reduced. Hk (calculated), which is calculated based on the assumption that $Ku_2$ is 0, is 23.9 kOe, which makes the saturation recording by a head difficult, but actually, Hk can be substantially reduced because $Ku_2$ is greater than 0.

Table 2 shows the overwrite (OW) characteristic and the signal/noise ratio (SNR) of the same perpendicular magnetic recording medium.

TABLE 2

| Deposition rate | OW1 | OW2 | SNR (470 kFCI) |
|---|---|---|---|
| 1 nm/second | 44.3 dB | 46.4 dB | 24.7 dB |
| 0.5 nm/second | 40.8 dB | 42.9 dB | 25.8 dB |

When the deposition rate of the underlayer was 0.5 nm/second, SNR was increased by about 1 dB when compared to the case of a deposition rate of 1.0 nm/second. The OW characteristics are both equal to or higher than 40 dB and thus are of a level causing no problems in practical use. The evaluation of the OW characteristic was performed such that, with regards to the perpendicular magnetic recording medium, the OW characteristic when a high linear recording density is written to a low linear recording density is assumed as OW1 and a signal written with a low linear recording density is overwritten with a high linear recording density so that the ratio between the first written signal of the low linear recording density and the residual signal having the low linear recording density after the overwrite is calculated. With regards to the recording densities used, the low linear recording density is 53.5 kFCl (12 T) and the high linear recording density is 642 kFCl (1 T). The OW characteristic in the case where the low linear recording density is written to the high linear recording density (which is referred to as OW2) was obtained as in the case of OW1 in which the ratio between the first written signal of the high linear recording density and the residual signal having the high linear recording density after the overwrite is calculated. With regards to the recording densities used, the high linear recording density is 321 kFCl (2 T) and the low linear recording density is 42.8 kFCl (15 T).

Thus, a method for manufacturing a perpendicular magnetic recording medium has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

What is claimed is:

1. A method for producing a perpendicular magnetic recording medium, comprising:
    forming a non-magnetic underlayer consisting of Ru having a hexagonal close-packed crystal structure on a non-magnetic substrate;
    subjecting the surface of the underlayer to Ar gas mixed with oxygen of the mass/flow rate ratio of 1% to 10% under a gas pressure of 0.1 to 10 Pa for 1 to 10 seconds before forming the magnetic layer film; and
    forming a magnetic layer film comprising a multilayer lamination in which a Co layer as a first magnetic layer and a Pt layer or a Pd layer as a second magnetic layer are alternately laminated directly over the underlayer, wherein at least one of the first magnetic layer and the second magnetic layer comprises silicon oxide and is formed by sputtering using a target with added silicon oxide,
    wherein the underlayer is formed at a deposition rate equal to or lower than 0.7 nm/second.

2. A method for producing a perpendicular magnetic recording medium according to claim 1, wherein the underlayer is formed using a sputter method.

3. A method for producing a perpendicular magnetic recording medium according to claim 1, wherein the silicon oxide is $SiO_2$.

4. A method for producing a perpendicular magnetic recording medium according to claim 1, wherein the silicon oxide is added to at least one of the first or second magnetic layers in an amount equal to or higher than 1 mol % and equal to or lower than 10 mol %.

5. A method for producing a perpendicular magnetic recording medium according to claim 1, additionally comprising forming an orientation control layer between the non-magnetic substrate and the underlayer.

6. A method for producing a perpendicular magnetic recording medium according to claim 5, wherein the orientation control layer is formed by laminating a first orientation control layer and a second orientation control layer, the first orientation control layer being a Ta layer and the second orientation control layer being any one of a NiFeNbB layer, a NiFeCr layer, and a NiFeSi layer.

7. A method for producing a perpendicular magnetic recording medium according to claim 5, additionally comprising forming a soft magnetic backing layer between the non-magnetic substrate and the orientation control layer.

* * * * *